United States Patent
Wang et al.

(10) Patent No.: US 9,632,630 B2
(45) Date of Patent: Apr. 25, 2017

(54) TOUCH PANEL STRUCTURE (75) Inventors: Wei-Hsiang Wang, Taipei (TW); Chuan-Lang Lu, Hsinchu County (TW)

(73) Assignee: Tera Xtal Technology Corp., Hsinchu Science Park (TW)

( * ) Notice: Subject to any disclaimer, the term of this patent is extended or adjusted under 35 U.S.C. 154(b) by 1321 days.

(21) Appl. No.: 13/543,762

(22) Filed: Jul. 6, 2012

(65) Prior Publication Data
US 2013/0126327 A1 May 23, 2013

(30) Foreign Application Priority Data

Nov. 17, 2011 (TW) .............................. 100142110 A (51) Int. Cl.
*G06F 3/044* (2006.01)
*H05K 1/03* (2006.01)

(52) U.S. Cl.
CPC .............. *G06F 3/044* (2013.01); *H05K 1/03* (2013.01); *G06F 2203/04103* (2013.01); *H05K 2201/0108* (2013.01)

(58) Field of Classification Search
CPC ........... G06F 3/044; G06F 2203/04103; G06F 3/03547; H05K 1/03; H05K 1/0306;
(Continued)

(56) References Cited

U.S. PATENT DOCUMENTS 3,872,418 A * 3/1975 Plough ................... H01C 7/047
257/467
5,135,814 A * 8/1992 Dekosky ....................... 428/432
(Continued)

FOREIGN PATENT DOCUMENTS

| CN | 102097561 | 6/2011 |
| JP | 2010515969 | 5/2010 |
| JP | 2011090443 | 5/2011 |

OTHER PUBLICATIONS

CN102097561 Abstract.
(Continued)

*Primary Examiner* — Ishwarbhai B Patel
(74) *Attorney, Agent, or Firm* — Law Offices of John Parrish (57) ABSTRACT

A touch panel structure is provided. The touch panel structure includes a sapphire substrate having a crystal axis, a crystal structure and a transmittance, wherein the crystal axis includes one selected from a group consisting of c-axis (0001), a-axis ($1\bar{2}10$), a-axis ($1\ \bar{1}20$), a-axis ($2\bar{1}\bar{1}0$), a-axis ($\bar{1}\bar{1}20$), a-axis ($\bar{2}1\ 10$), a-axis ($\bar{1}2\bar{1}0$), m-axis ($\bar{1}010$), m-axis ($\bar{1}100$), m-axis ($01\bar{1}0$), m-axis ($10\bar{1}0$), m-axis ($1\bar{1}00$), m-axis ($0\bar{1}10$), r-axis ($10\bar{1}1$), r-axis ($\bar{1}01\bar{1}$), r-axis ($01\bar{1}\bar{1}$), r-axis ($0\bar{1}1\ 1$), r-axis ($1\bar{1}0\bar{1}$) and r-axis ($\bar{1}101$), the crystal structure is a single-crystal structure, and the transmittance is one of percentages larger than and equal to 80%; and a sensing module including a first sensing layer directly disposed on the sapphire substrate.

8 Claims, 10 Drawing Sheets (58) Field of Classification Search
CPC .... H05K 1/16; H05K 1/18; H05K 2201/0108; H05K 1/0287; H05K 1/0289
USPC .......................... 174/250–268; 345/173, 174
See application file for complete search history.

(56) References Cited

U.S. PATENT DOCUMENTS

| | | |
|---|---|---|
| 8,653,378 B2* | 2/2014 | Fan ................ 174/255 |
| 8,697,230 B2* | 4/2014 | Ago ....................... B82Y 30/00 |
| | | 423/448 |
| 2002/0104968 A1* | 8/2002 | Stewart .................... 250/353 |
| 2004/0109486 A1* | 6/2004 | Kinoshita et al. .............. 372/45 |
| 2008/0165158 A1 | 7/2008 | Hotelling |
| 2010/0079384 A1 | 4/2010 | Grivna |
| 2011/0157086 A1* | 6/2011 | Ozeki et al. .................. 345/174 |
| 2012/0037068 A1* | 2/2012 | Su et al. ........................ 117/95 |

OTHER PUBLICATIONS

JP2010515969 Abstract.
JP2011076866 Abstract.
JP2011090443 Abstract.

* cited by examiner

150
TOUCH PANEL STRUCTURE

CROSS-REFERENCE TO RELATED APPLICATION AND CLAIM OF PRIORITY

The application claims the benefit of Taiwan Patent Application No. 100142110, filed on Nov. 17, 2011, in the Taiwan Intellectual Property Office, the disclosures of which are incorporated herein in their entirety by reference.

FIELD OF THE INVENTION

The present invention relates to a touch panel structure, and more particularly to a touch panel structure using a sapphire substrate to serve as the material of the touch panel.

BACKGROUND OF THE INVENTION

Currently, the touch control technology is mainly divided into five types: the resistive type, the capacitive type, the surface acoustic wave type, the optical type (infrared rays) and the electromagnetic type. The touch control technology is mainly applied to the public field such as the ATM, the ticket affairs, the educational system, the cash register, etc., since it was invented in 1974. The resistive touch control technology has always been the mainstream touch control technology. However, the touch control technology is applied to the personal mobile device, since APPLE released the i-phone in 2008. This enables the touch control technology to be promoted to the capacitive touch control technology. Although the cost of the resistive touch control technology is low, the resistive touch control technology is still unpopular since it is not wear-resisting and has a slow response speed and a low transmittance. However, although the surface acoustic wave touch control technology and the optical touch control technology have good precision and durability, they are too costly to become the mainstream technologies. Although the electromagnetic touch control technology has good sensitivity and durability, it occupies a large volume, is difficult to assemble, and needs a dedicated electromagnetic pen. Therefore, the capacitive touch control technology will continue to be the mainstream touch control technology in the next few years.

Currently, the capacitive touch technology is divided into two types: the surface capacitive touch technology and the projective capacitive touch technology. The surface capacitive touch technology has the advantages of a large area, a low cost and low energy consumption; however, the disadvantages thereof are that the corners and edges of the touch panel have low precision and are more sensitive to electromagnetic induction. The projective capacitive touch technology enhances precision through the x-axis and the y-axis sensors; however, the disadvantage thereof is that the process for manufacturing the x-axis and the y-axis sensors is more complicated. But even so, since lots of factories invest time and money in developing the x-axis and the y-axis sensors, the costs thereof have been greatly reduced. For example, the price of the i-pad 2 is far cheaper than that of the i-pad 1. Therefore, in recent years, the application of the projective capacitive touch technology is still continually increased. For the current capacitive touch technology, the cover for the touch panel is usually made of glass. Although the polyethylene terephthalate (PET) is used, the glass is still the mainstream in the market due to the consideration of durability. However, since the strength of the glass is poorer, the tempered glass is introduced to the application of the capacitive touch technology. The tempered glass is manufactured by soaking the glass in the chemical medicinal liquid to strengthen the glass. Then, the tempered glass is cut according to the requested size by the customer to serve as the cover for the touch panel. Finally, the tempered glass is bonded to the sensor. However, after the tempered glass is cut, tiny holes will be generated at the edge portion thereof. The tiny holes will lead to fracture in the subsequent bonding process. Although someone proposes cutting the glass first and then soaking it in the chemical medicinal liquid, the cost will be greatly increased.

Figure 1:
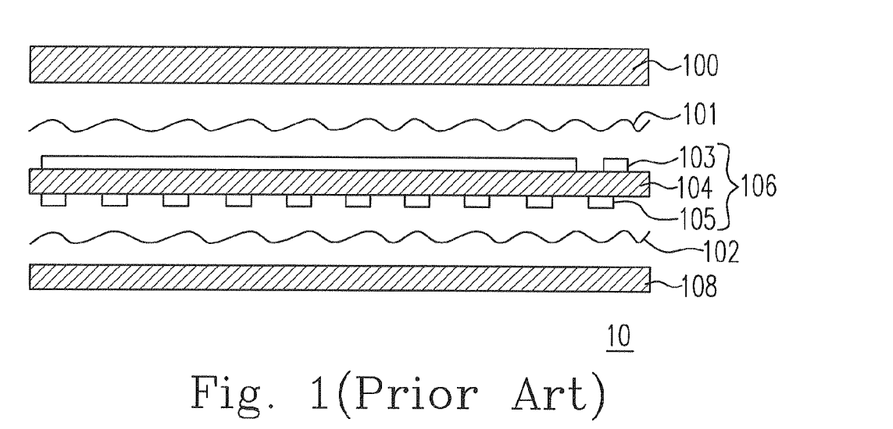
FIG. 1 shows the structure of a conventional projective capacitive touch panel.

Please refer to FIG. 1, which shows the structure of a conventional projective capacitive touch panel 10. The conventional projective capacitive touch panel 10 includes a cover 100, optical glues 101, 102, a sensing module 106 and a display panel 108. The sensing module 106 includes sensing layers 103, 105 and a sensing substrate 104. The sensing module 106 is bonded to the cover 100 via the optical glue 101. Through the optical glue 101, the sensing layer 103 is bonded to the cover 100. The sensing module 106 is bonded to the display panel 108 via the optical glue 102. Through the optical glue 102, the sensing layer 105 is bonded to the display panel 108.

The cover 100 is made of glass. The sensing layers 103, 105 are formed on the sensing substrate 104 via the conventional semiconductor process, thereby completing the manufacture of the sensing module 106. Besides, after the sensing module 106 is manufactured, it needs to be bonded to the cover 100 via the optical glue 101. In this way, the process needs one more step. Moreover, the hardness and the mechanical strength issues will be generated when the cover 100 is made of glass.

Figure 2:
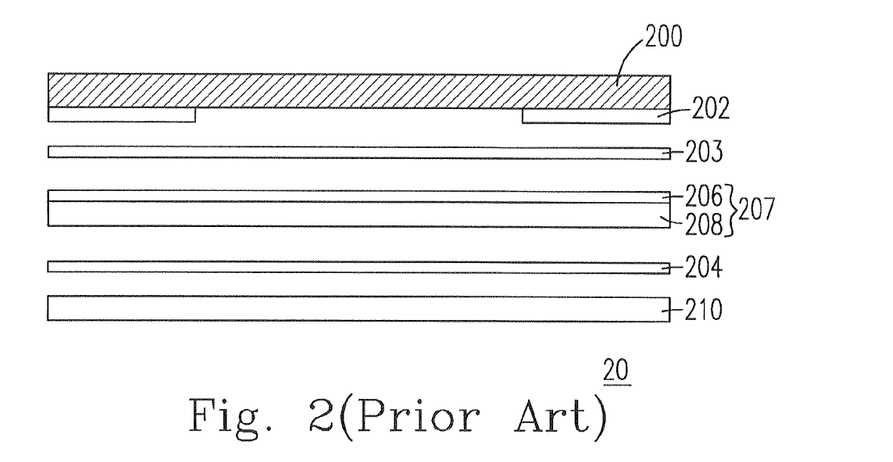
FIG. 2 shows the structure of a conventional projective capacitive touch sensor.

Please refer to FIG. 2, which shows the structure of a conventional projective capacitive touch sensor 20. The conventional projective capacitive touch sensor 20 includes a cover 200, a specific pattern 202, optical glues 203, 204, a glass touch sensor 207 and a display panel 210. The glass touch sensor 207 includes a sensing control chip 206 and a glass substrate 208.

The sensing control chip 206 is made of the indium tin oxide (ITO). The sensing control chip 206 is constructed on the glass substrate 208 via the conventional semiconductor process, thereby forming the glass touch sensor 207. The glass substrate 208 is bonded to the display panel 210 via the optical glue 204 so that the glass touch sensor 207 is bonded to the display panel 210. The cover 200 is usually made of glass or the PET film. The specific pattern 200 can be formed at the lower portion of the cover 200. The sensing control chip 206 is bonded to the specific pattern 202 via the optical glue 203 so that the glass touch sensor 207 is bonded to the cover 200.

Figure 3A:
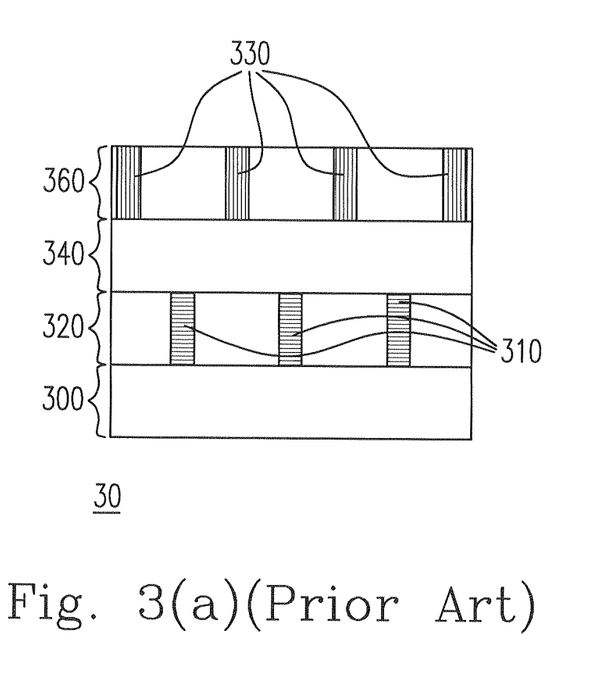
FIG. 3(a) shows the structure of a control chip of a conventional projective capacitive touch sensor.

Please refer to FIG. 3(a), which shows the structure of a control chip 30 of a conventional projective capacitive touch sensor. The control chip 30 includes a glass substrate 300, ITO transparent conductive films 320, 360 and an insulating layer 340. Firstly, the ITO transparent conductive film 320 is manufactured on the glass substrate 300 via the film process. Then, an x-axis transparent conductive net 310 is manufactured in the ITO transparent conductive film 320. Next, the insulating layer 340 is manufactured on the ITO transparent conductive film 320, and then the ITO transparent conductive film 360 is manufactured on the insulating layer 340 via the film process. Finally, a y-axis transparent conductive net 330 is manufactured in the ITO transparent conductive film 360. The insulating layer 340 is for isolating the x-axis transparent conductive net 310 from the y-axis transparent conductive net 330.

Figure 3B:
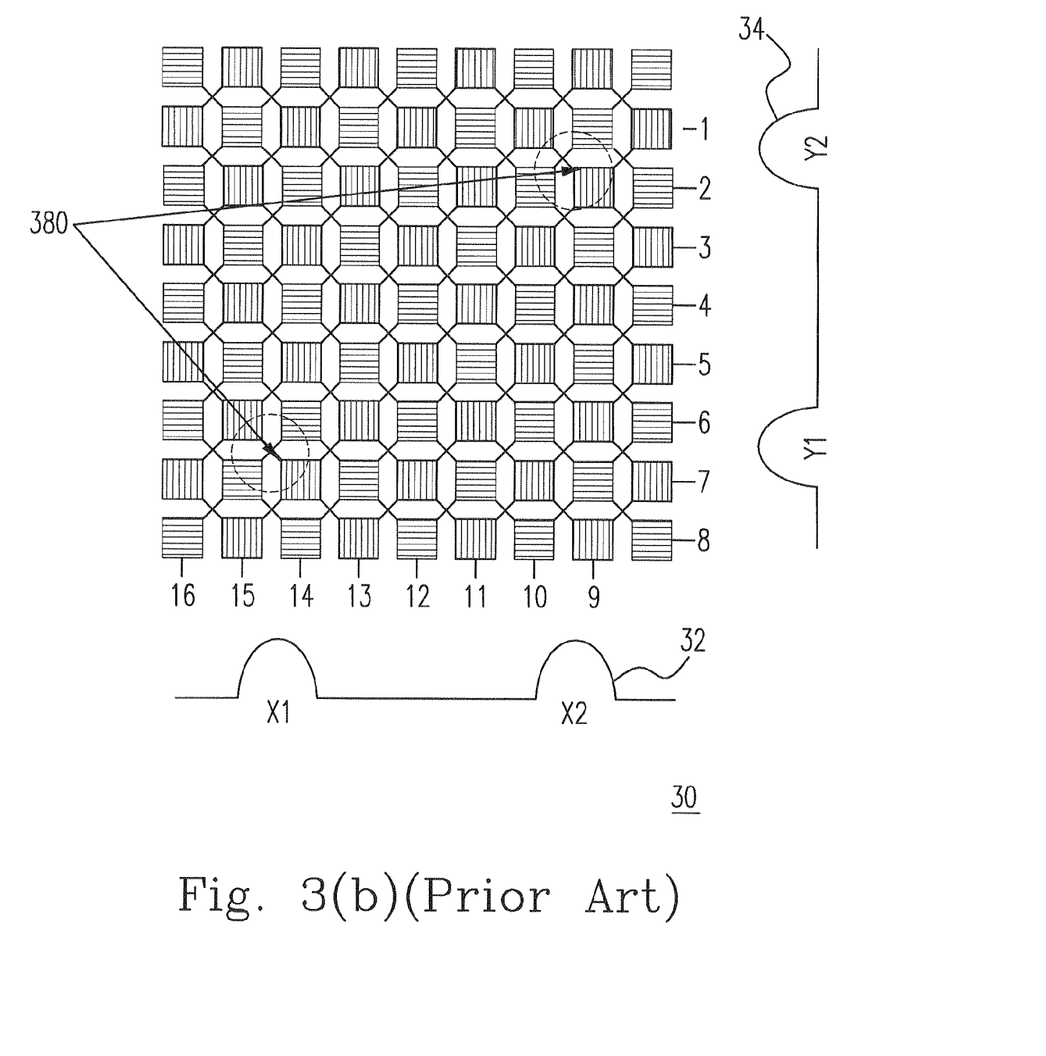
FIG. 3(b) is a top view of FIG. 3(a)

Please refer to FIG. 3(b), which is a top view of FIG. 3(a). When the control chip 30 is touched by the finger of the user, the capacitance value of the touch area 380 is changed. Therefore, through the x-axis signal scan and the y-axis signal scan, and the noise suppression for the scanned x-axis signal 32 and the scanned y-axis signal 34, the coordinate of the touching area 380 can be determined.

The above-mentioned conventional covers 100, 200 are made of glass. Besides, the sensing module 106 needs to be bonded to the cover 100 via the optical glue 101, and the glass touch sensor 207 needs to be bonded to the cover 200 via the optical glue 203. Moreover, the hardness and the mechanical strength issues of the glass are to be overcome. Currently, the surface of the cellphone of the user is usually pasted by a paster to prevent scrape, or is plated by the fluoride to prevent greasiness. Besides, using the glass substrate 208 to serve as the substrate of the glass touch sensor 207 will meet the issue that the volume thereof is unable to be reduced. For ensuring the strength of the conventional projective capacitive touch panel 10, the thickness of the cover 100 cannot be too thin. Accordingly, the thickness of the entire conventional projective capacitive touch panel 10 is thicker. Based on the above, it is shown that the covers 100, 200 made of glass are to be improved.

In order to overcome the drawbacks in the prior art, a touch panel structure is provided. The particular design in the present invention not only solves the problems described above, but also is easy to be implemented. Thus, the present invention has the utility for the industry.

SUMMARY OF THE INVENTION

In accordance with an aspect of the present invention, a touch panel structure is provided. The touch panel structure includes a sapphire substrate having a crystal axis, a crystal structure and a transmittance, wherein the crystal axis includes one selected from a group consisting of c-axis (0001), a-axis (1$\bar{2}$10), a-axis (1 $\bar{1}$20), a-axis (2$\bar{1}\bar{1}$0), a-axis ($\bar{1}\bar{1}$20), a-axis ($\bar{2}$1 10), a-axis ($\bar{1}$2$\bar{1}$0), m-axis ($\bar{1}$010), m-axis ($\bar{1}$100), m-axis (01$\bar{1}$0), m-axis (10$\bar{1}$0), m-axis ($\bar{1}$100), m-axis (0$\bar{1}$10), r-axis (10$\bar{1}$1), r-axis ($\bar{1}$0 1$\bar{1}$), r-axis (01$\bar{1}\bar{1}$), r-axis (0$\bar{1}$1 1), r-axis ($\bar{1}\bar{1}$0$\bar{1}$) and r-axis ($\bar{1}$101), the crystal structure is a single-crystal structure, and the transmittance is one of percentages larger than and equal to 80%; and a sensing module including a first sensing layer directly disposed on the sapphire substrate.

In accordance with another aspect of the present invention, a touch panel structure is provided. The touch panel structure includes a sapphire substrate having a crystal structure and a transmittance, wherein the crystal structure is a single-crystal structure, and the transmittance is one of percentages larger than and equal to 80%; and a sensing module including a first sensing layer directly disposed on the sapphire substrate.

In accordance with a further aspect of the present invention, a touch panel structure is provided. The touch panel structure includes a sapphire substrate having a single-crystal structure; and a sensing module including a first sensing layer directly disposed on the sapphire substrate.

In accordance with further another aspect of the present invention, a touch panel structure is provided. The touch panel structure includes a touch screen; and a sensing module having a bottom layer directly disposed on the touch screen.

According to the touch panel structure of the present invention, the sensing module is directly disposed on the sapphire substrate by a semiconductor process, and the sapphire substrate simultaneously serves as the cover for the touch panel structure. The hardness of the sapphire substrate is only smaller than that of the diamond, but far larger than that of the tempered glass. Besides, the sapphire substrate is scratch-resisting, anticorrosive and thin.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 4A:
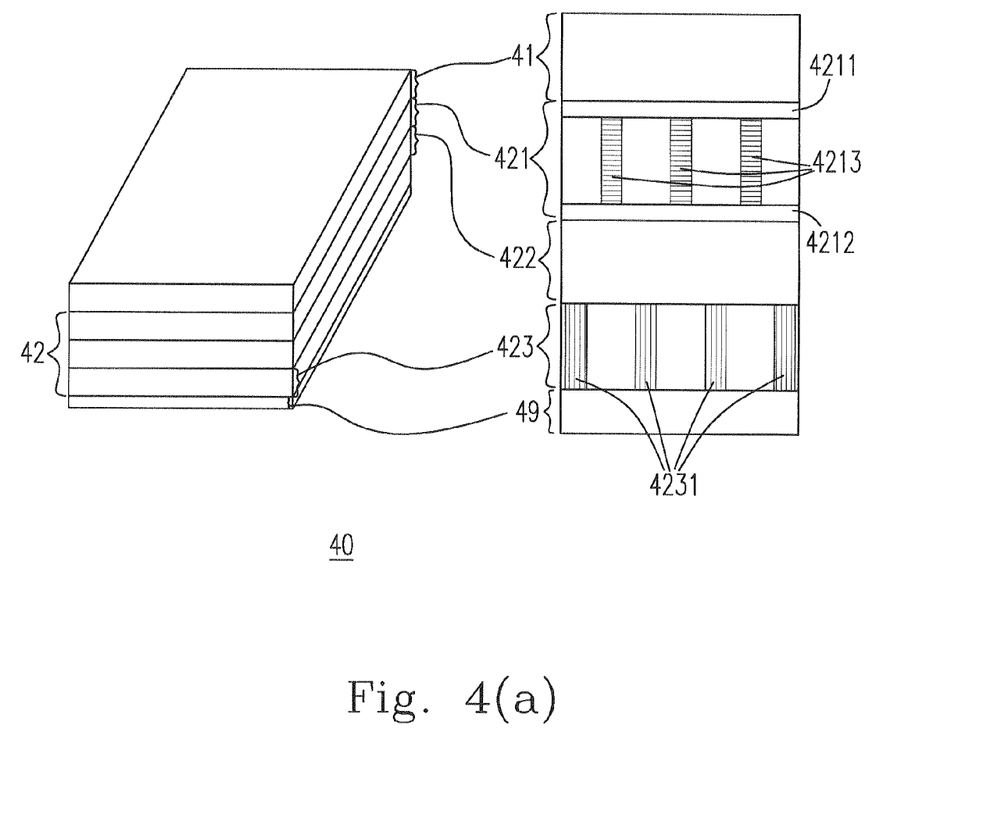
FIG. 4(a) shows a touch panel structure according to a first embodiment of the present invention.

Please refer to FIG. 4(a), which shows a touch panel structure 40 according to a first embodiment of the present invention. The touch panel structure 40 is a two-layer ITO structure, and includes a sapphire substrate 41 and a sensing module 42. The sensing module 42 includes a first sensing layer 421 directly disposed on the sapphire substrate 41. The sensing module 42 further includes an insulating layer 422 and a second sensing layer 423. The first sensing layer 421 has a first surface 4211 and a second surface 4212. The first surface 4211 directly contacts the sapphire substrate 41. The insulating layer 422 is formed on the second surface 4212, and the second sensing layer 423 is formed on the insulating layer 422. The sapphire substrate 41 further includes a front surface (not shown) and a rear surface (not shown). The sensing module 42 is directly disposed on the rear surface, and the front surface serves as the surface for touching.

The first sensing layer 421 includes an x-axis sensing circuit net 4213, and the second sensing layer 423 includes a y-axis sensing circuit net 4231. The x-axis sensing circuit net 4213 and the y-axis sensing circuit net 4231 interlaces with each other from a top view and are not electrically connected to each other. The first sensing layer 421 and the second sensing layer 423 are both indium tin oxide (ITO)

transparent conductive films. The touch panel structure 40 further includes a conducting wire circuit layer 49. The conducting wire circuit layer 49 is formed on the second sensing layer 423, and electrically connected to the x-axis sensing circuit net 4213 and the y-axis sensing circuit net 4231. The x-axis sensing circuit net 4213 is electrically connected to the conducting wire circuit layer 49 via the conducting wire (not shown) uncovered by the insulating layer 422.

The sapphire substrate 41 has a crystal axis, a crystal structure and a transmittance. The crystal axis includes one selected from a group consisting of c-axis (0001), a-axis ($1\bar{2}10$), a-axis ($1\,1\bar{2}0$), a-axis ($2\bar{1}\bar{1}0$), a-axis ($\bar{1}\bar{1}20$), a-axis ($\bar{2}1\,10$), a-axis ($\bar{1}2\bar{1}0$), m-axis ($\bar{1}010$), m-axis ($\bar{1}100$), m-axis ($01\bar{1}0$), m-axis ($10\bar{1}0$), m-axis ($1\bar{1}00$), m-axis ($0\bar{1}10$), r-axis ($10\bar{1}1$), r-axis ($\bar{1}01\bar{1}$), r-axis ($01\bar{1}\bar{1}$), r-axis ($0\bar{1}1\,1$), r-axis ($1\bar{1}0\bar{1}$) and r-axis ($\bar{1}101$). The crystal structure is a single-crystal structure, and the transmittance is larger than or equal to 80%. Since the sapphire substrate 41 has a hard material and a large mechanical strength, and is scratch-resisting and anticorrosive, it is suitable for serving as a cover for the touch panel structure 40. However, not all kinds of sapphires are suitable for serving as the cover. Only the sapphire having a single-crystal structure is suitable for serving as the cover since the transmittance thereof is larger than 80%; the sapphire having a poly-crystal structure is not suitable for serving as the cover since the transmittance thereof is smaller than 60%, which does not meet the requirement.

Moreover, the physical or optical characteristics of the sapphire substrate 41 vary with the crystal axis thereof. For example, the physical characteristics of the sapphire substrate 41 include at least one of the hardness, the Young's modulus, the compressive strength and the thermal conductivity. For example, the optical characteristics of the sapphire substrate 41 include the transmittance. Table 1 shows the comparison of each crystal axis of the sapphire substrate 41 with the tempered glass on the physical and optical characteristics.

TABLE 1

| Characteristic | Unit | C-axis of sapphire | A-axis of sapphire | R-axis of sapphire | M-axis of sapphire | Tempered glass |
|---|---|---|---|---|---|---|
| Hardness | Kgf/cm2 | 2150 ± 50 | 1850 ± 50 | 2200 ± 50 | 1850 ± 50 | 674 |
| Young's modulus | GPa | 460 ± 50 | 460 ± 50 | 460 ± 50 | 460 ± 50 | 71.7 |
| Compressive strength | MPa | 2000 | 2000 | 2000 | 2000 | 800 |
| Thermal conductivity | W/m-k | 32 ± 5 | 32 ± 5 | 32 ± 5 | 32 ± 5 | 1.2 |
| Transmittance | % | >85 | >85 | >85 | >85 | >90 |

When the crystal axis of the sapphire substrate 41 is anyone of the c-axis, a-axis, m-axis and r-axis, the hardness, the Young's modulus, the compressive strength and the thermal conductivity of the sapphire substrate 41 are all far better than those of the tempered glass. Although the transmittance of the sapphire substrate 41 is a bit lower than that of the tempered glass, it is still not bad.

Figure 4B:
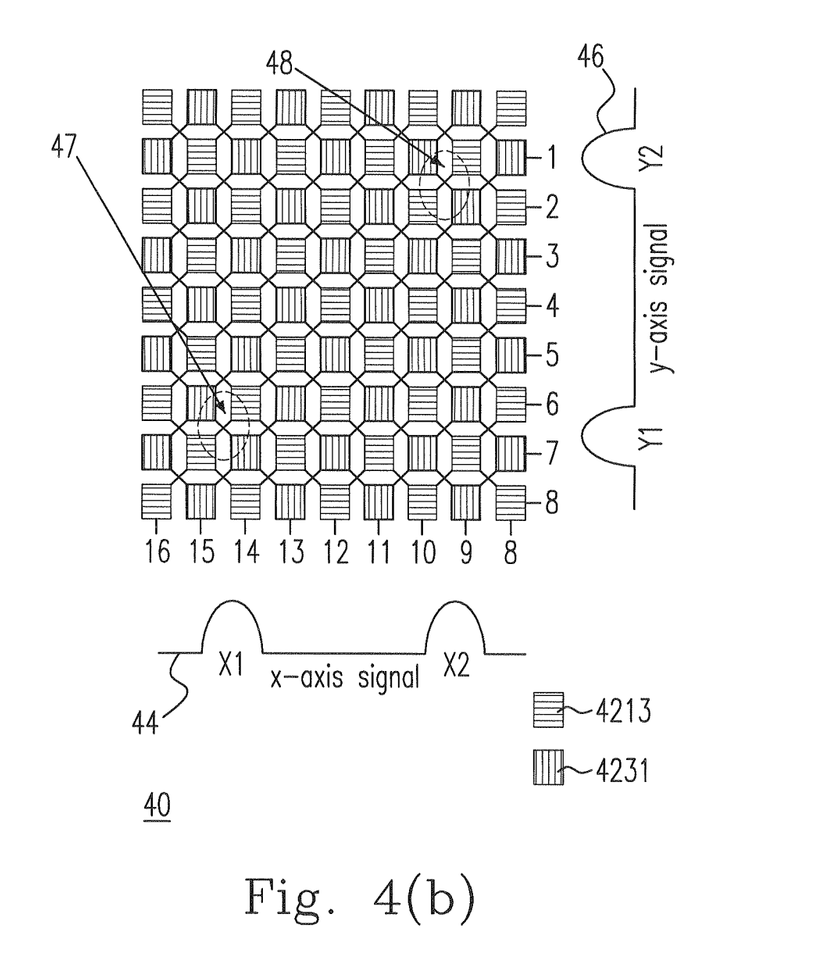
FIG. 4(b) is a top view of FIG. 4(a)

Please refer to FIG. 4(*b*), which is a top view of FIG. 4(*a*). When the sapphire substrate 41 is touched by the finger of the user, the sensing module 42 sends an x-axis signal 44 and a y-axis signal 46 in response to the finger touch so that the x-axis coordinate and the y-axis coordinate of the finger touch point 47 and those of the finger touch point 48 are determined. For example, the x-axis coordinate of the finger touch point 47 is about 14.5, and the y-axis coordinate thereof is about 6.5; the x-axis coordinate of the finger touch point 48 is about 9.5, and the y-axis coordinate thereof is about 1.5.

Figure 5:
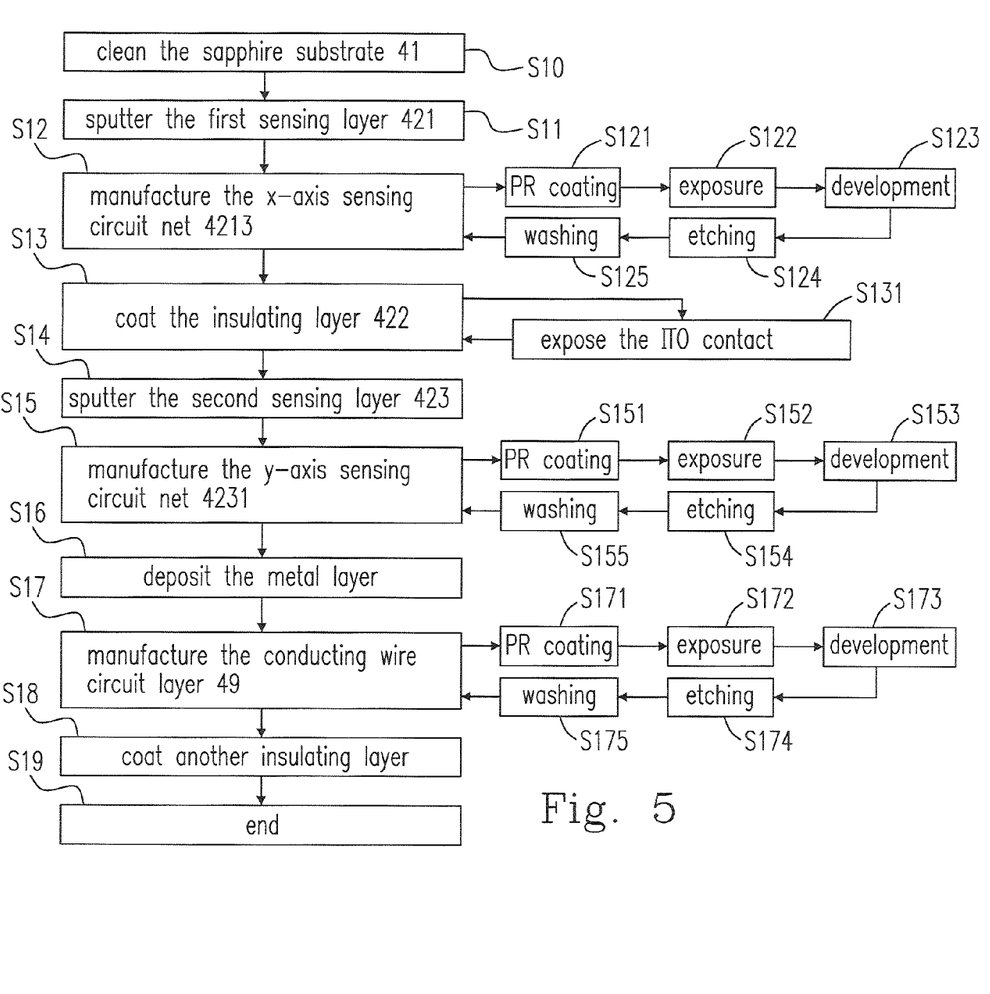
FIG. 5 is a flowchart for manufacturing a touch panel structure according to a first embodiment of the present invention.

Please refer to FIG. 5, which is a flowchart for manufacturing a touch panel structure 40 according to a first embodiment of the present invention. The sensing module 42 is formed on the sapphire substrate 41 via a photolithography process. The flowchart includes the following steps:

S10: clean the sapphire substrate 41 with an acid solution; (since the sapphire substrate 41 is anticorrosive, the acid solution is preferably the aqua regia)

S11: sputter the first sensing layer 421 on the surface of the cleaned sapphire substrate 41; (preferably, the first sensing layer 421 is an ITO transparent conductive layer)

S12: perform a first photolithography process for the first sensing layer 421 to manufacture the x-axis sensing circuit net 4213;

S13: coat the insulating layer 422 on the x-axis sensing circuit net 4213;

S14: sputter the second sensing layer 423; (preferably, the second sensing layer 423 is an ITO transparent conductive layer)

S15: perform a third photolithography process for the second sensing layer 423 to manufacture the y-axis sensing circuit net 4231;

S16: deposit the metal layer;

S17: manufacture the conducting wire circuit layer 49 by a fourth photolithography process;

S18: coat another insulating layer on the conducting wire circuit layer 49; and S19: end.

The first photolithography process further includes the following steps:

S121: coat the photoresist (PR) on the second surface 4212;

S122: expose the photoresist;

S123: perform the development;

S124: perform the etching to form the x-axis sensing circuit net 4213; and

S125: wash the x-axis sensing circuit net 4213.

The step S13 further includes the following step:

S131: perform a second photolithography process for the insulating layer 422 to expose the ITO contact.

The third photolithography process further includes the following steps:

S151: coat the photoresist on the second sensing layer 423;

S152: expose the photoresist;

S153: perform the development;

S154: perform the etching to form the y-axis sensing circuit net 4231; and

S155: wash the y-axis sensing circuit net 4231.

The fourth photolithography process further includes the following steps:

S171: coat the photoresist on the metal layer;
S172: expose the photoresist;
S173: perform the development;
S174: perform the etching to form the conducting wire circuit layer 49; and
S175: wash the conducting wire circuit layer 49.

Figure 6A:
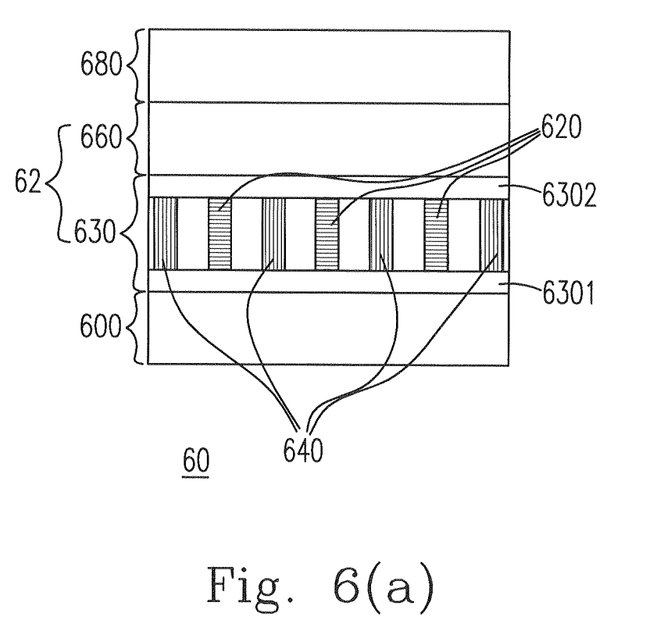
FIG. 6(a) shows a touch panel structure according to a second embodiment of the present invention.

Please refer to FIG. 6(a), which shows a touch panel structure 60 according to a second embodiment of the present invention. The touch panel structure 60 includes a sapphire substrate 600 and a sensing module 62. The sensing module 62 includes a sensing layer 630 directly disposed on the sapphire substrate 600. The sensing module 62 further includes an insulating layer 660. The sensing layer 630 has a first surface 6301 and a second surface 6302. The first surface 6301 directly contacts the sapphire substrate 600. The insulating layer 660 is formed on the second surface 6302.

The sensing layer 630 includes an x-axis sensing circuit net 620 and a y-axis sensing circuit net 640. The x-axis sensing circuit net 620 and the y-axis sensing circuit net 640 interlaces with each other from a top view and are not electrically connected to each other. The sensing layer 630 is an indium tin oxide (ITO) transparent conductive film. The sensing module 62 is formed on the sapphire substrate 600 via a photolithography process. The touch panel structure 60 further includes a conducting wire circuit layer 680. The conducting wire circuit layer 680 is formed on the insulating layer 660, and electrically connected to the x-axis sensing circuit net 6301 and the y-axis sensing circuit net 6302. The x-axis sensing circuit net 620 is electrically connected to the conducting wire circuit layer 680 via the conducting wire (not shown) uncovered by the insulating layer 660.

The sapphire substrate 600 has a crystal axis, a crystal structure and a transmittance. The crystal axis includes one selected from a group consisting of c-axis, a-axis, m-axis and r-axis. The crystal structure is a single-crystal structure, and the transmittance is larger than or equal to 80%. The sapphire substrate 600 serves as a cover for the touch panel structure 60.

Figure 6B:
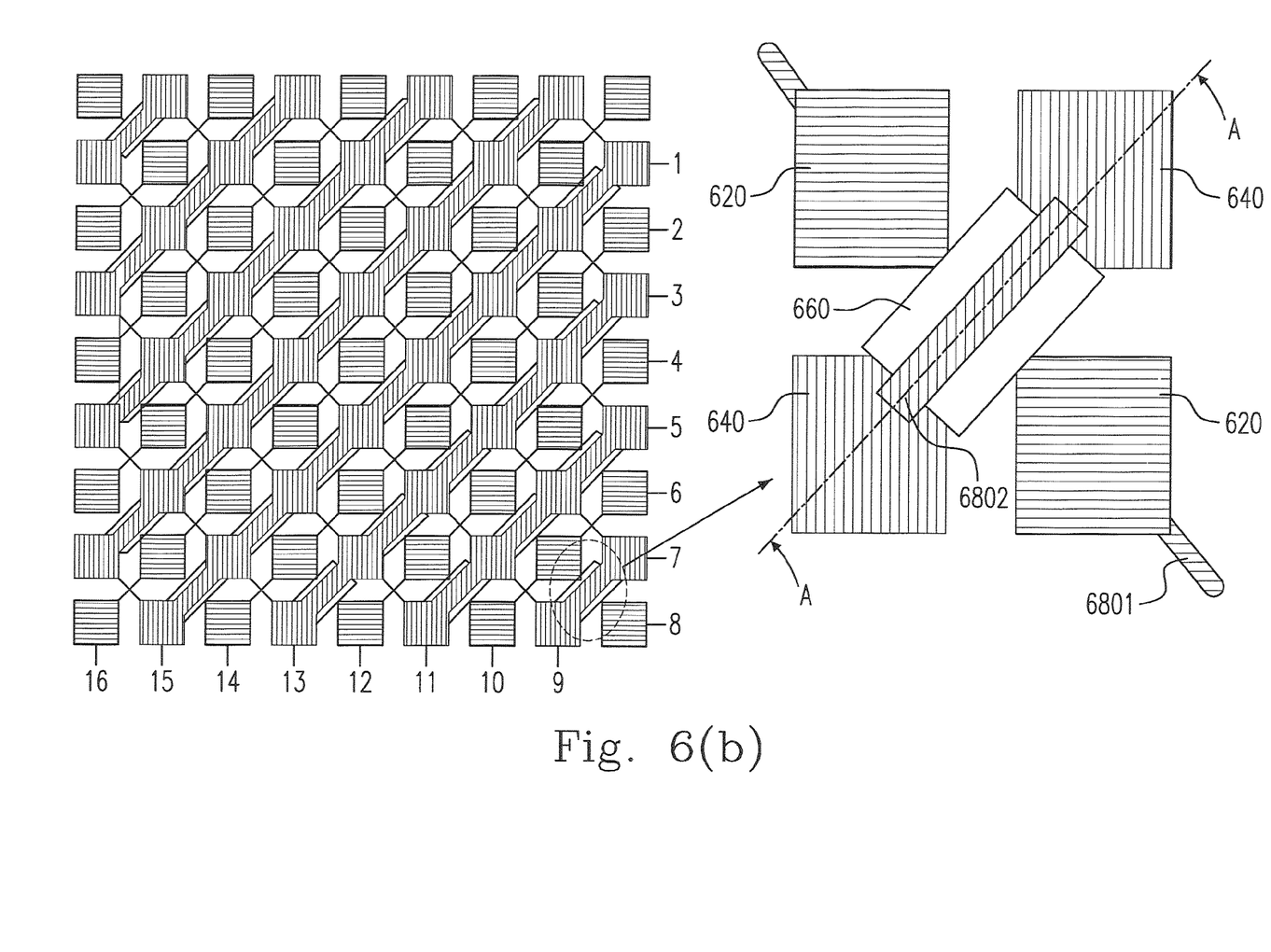
FIG. 6(b) is a top view of FIG. 6(a)
Figure 6C:
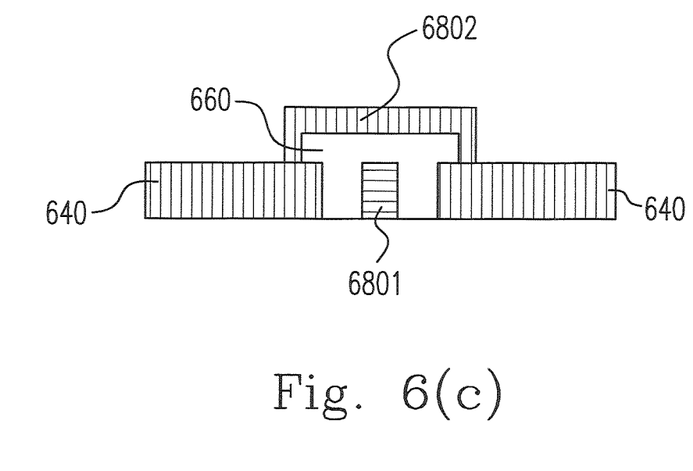
FIG. 6(c) is a cross-sectional view of FIG. 6(b) along the A-A line.

Please refer to FIG. 6(b), which is a top view of FIG. 6(a). The second embodiment differs from the first embodiment in that the x-axis sensing circuit net 620 and the y-axis sensing circuit net 640 are manufactured in the same layer. In the conducting wire circuit layer 680, the x-axis sensing circuit net 620 is electrically connected to the x-axis conducting wire 6801, and the y-axis sensing circuit net 640 is electrically connected to the y-axis conducting wire 6802. Please refer to FIG. 6(c), which is a cross-sectional view of FIG. 6(b) along the A-A line. As shown in FIG. 6(c), after the insulating layer 660 is formed, the y-axis conducting wire 6802 is electrically connected to the y-axis sensing circuit net 640.

Figure 7:
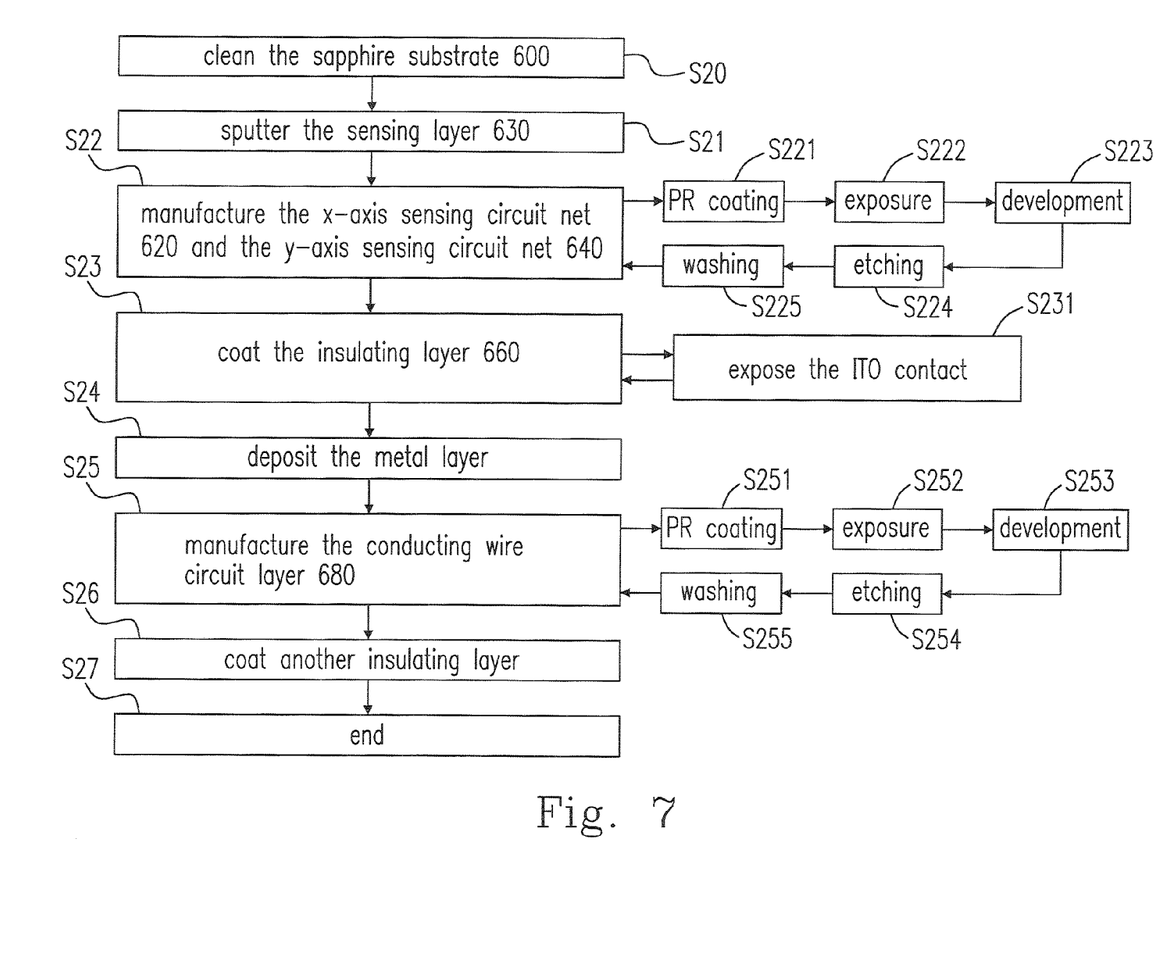
FIG. 7 is a flowchart for manufacturing a touch panel structure according to a second embodiment of the present invention.

Please refer to FIG. 7, which is a flowchart for manufacturing a touch panel structure 60 according to a second embodiment of the present invention. The flowchart includes the following steps:

S20: clean the sapphire substrate 600 with the aqua regia;
S21: sputter the sensing layer 630 on the cleaned sapphire substrate 600; (preferably, the sensing layer 630 is an ITO transparent conductive layer)
S22: perform a first photolithography process for the sensing layer 630 to manufacture the x-axis sensing circuit net 620 and the y-axis sensing circuit net 640;
S23: coat the insulating layer 660 on the x-axis sensing circuit net 620 and the y-axis sensing circuit net 640;
S24: deposit the metal layer on the insulating layer 660;
S25: manufacture the conducting wire circuit layer 680 by a third photolithography process;
S26: coat another insulating layer on the conducting wire circuit layer 680; and
S27: end.

The first photolithography process further includes the following steps:

S221: coat the photoresist on the second surface 6302;
S222: expose the photoresist;
S223: perform the development;
S224: perform the etching to form the x-axis sensing circuit net 620 and the y-axis sensing circuit net 640; and
S225: wash the x-axis sensing circuit net 620 and the y-axis sensing circuit net 640.

The step S23 further includes the following step:
S231: perform a second photolithography process for the insulating layer 660 to expose the ITO contact.

The third photolithography process further includes the following steps:

S251: coat the photoresist on the metal layer;
S252: expose the photoresist;
S253: perform the development;
S254: perform the etching to form the conducting wire circuit layer 680; and
S255: wash the conducting wire circuit layer 680.

Embodiments

1. A touch panel structure, comprising:
a sapphire substrate having a crystal axis, a crystal structure and a transmittance, wherein the crystal axis includes one selected from a group consisting of c-axis (0001), a-axis ($1\bar{2}10$), a-axis (1 1$\bar{2}$0), a-axis ($2\bar{1}\bar{1}0$), a-axis ($\bar{1}\bar{1}20$), a-axis ($\bar{2}1$ 10), a-axis ($\bar{1}2\bar{1}0$), m-axis ($\bar{1}010$), m-axis ($\bar{1}100$), m-axis ($01\bar{1}0$), m-axis ($10\bar{1}0$), m-axis ($1\bar{1}00$), m-axis ($0\bar{1}10$), r-axis ($10\bar{1}1$), r-axis ($\bar{1}01\bar{1}$), r-axis ($01\bar{1}\bar{1}$), r-axis ($0\bar{1}1$ 1), r-axis (1 $\bar{1}0\bar{1}$) and r-axis ($\bar{1}101$), the crystal structure is a single-crystal structure, and the transmittance is one of percentages larger than and equal to 80%; and
a sensing module including a first sensing layer directly disposed on the sapphire substrate.

2. The touch panel structure of Embodiment 1, wherein:
the sensing module further includes an insulating layer and a second sensing layer;
the first sensing layer has a first surface and a second surface, wherein the first surface directly contacts the sapphire substrate, and the insulating layer is formed on the second surface;
the second sensing layer is formed on the insulating layer;
the first sensing layer includes an x-axis sensing circuit net, and the second sensing layer includes a y-axis sensing circuit net, wherein the x-axis sensing circuit net and the y-axis sensing circuit net interlaces with each other from a top view and are not electrically connected to each other;
the first sensing layer and the second sensing layer are both indium tin oxide (ITO) transparent conductive films; and
the sensing module is formed on the sapphire substrate by a photolithography process.

3. The touch panel structure of any one of Embodiments 1-2, wherein the touch panel structure further comprises a conducting wire circuit layer formed on the second sensing layer, and electrically connected to the x-axis sensing circuit net and the y-axis sensing circuit net; and the sapphire substrate serves as a cover for the touch panel structure.

4. The touch panel structure of any one of Embodiments 1-3, wherein:

the sensing module further includes an insulating layer;

the first sensing layer has a first surface and a second surface, wherein the first surface directly contacts the sapphire substrate, and the insulating layer is formed on the second surface;

the first sensing layer includes an x-axis sensing circuit net and a y-axis sensing circuit net, wherein the x-axis sensing circuit net and the y-axis sensing circuit net interlaces with each other from a top view and are not electrically connected to each other;

the first sensing layer is an ITO transparent conductive film; and the sensing module is formed on the sapphire substrate by a photolithography process.

5. The touch panel structure of any one of Embodiments 1-4, wherein the touch panel structure further comprises a conducting wire circuit layer formed on the insulating layer, and electrically connected to the x-axis sensing circuit net and the y-axis sensing circuit net; and the sapphire substrate serves as a cover for the touch panel structure.

6. A touch panel structure, comprising:

a sapphire substrate having a crystal structure and a transmittance, wherein the crystal structure is a single-crystal structure, and the transmittance is one of percentages larger than and equal to 80%; and a sensing module including a first sensing layer directly disposed on the sapphire substrate.

7. The touch panel structure of Embodiment 6, wherein:

the sapphire substrate further has a crystal axis including one selected from a group consisting of c-axis (0001), a-axis ($1\bar{2}10$), a-axis ($1\ 1\bar{2}0$), a-axis ($2\bar{1}\bar{1}0$), a-axis ($\bar{1}\bar{1}20$), a-axis ($\bar{2}1\ 10$), a-axis ($\bar{1}2\bar{1}0$), m-axis ($\bar{1}010$), m-axis ($\bar{1}100$), m-axis ($01\bar{1}0$), m-axis ($10\bar{1}0$), m-axis ($1\bar{1}00$), m-axis ($0\bar{1}10$), r-axis ($10\bar{1}1$), r-axis ($\bar{1}01\bar{1}$), r-axis ($01\bar{1}\bar{1}$), r-axis ($0\bar{1}1\ 1$), r-axis ($1\ \bar{1}0\bar{1}$) and r-axis ($\bar{1}101$);

the sensing module further includes an insulating layer and a second sensing layer;

the first sensing layer has a first surface and a second surface, wherein the first surface directly contacts the sapphire substrate, and the insulating layer is formed on the second surface;

the second sensing layer is formed on the insulating layer;

the first sensing layer includes an x-axis sensing circuit net, and the second sensing layer includes a y-axis sensing circuit net, wherein the x-axis sensing circuit net and the y-axis sensing circuit net interlaces with each other from a top view and are not electrically connected to each other;

the first sensing layer and the second sensing layer are both indium tin oxide (ITO) transparent conductive films; and the sensing module is formed on the sapphire substrate by a photolithography process.

8. The touch panel structure of any one of Embodiments 6-7, wherein the touch panel structure further comprises a conducting wire circuit layer formed on the second sensing layer, and electrically connected to the x-axis sensing circuit net and the y-axis sensing circuit net; and the sapphire substrate serves as a cover for the touch panel structure.

9. The touch panel structure of any one of Embodiments 6-8, wherein:

the sapphire substrate further has a crystal axis including one selected from a group consisting of c-axis (0001), a-axis ($1\bar{2}10$), a-axis ($1\ 1\bar{2}0$), a-axis ($2\bar{1}\bar{1}0$), a-axis ($\bar{1}\bar{1}20$), a-axis ($\bar{2}1\ 10$), a-axis ($\bar{1}2\bar{1}0$), m-axis ($\bar{1}010$), m-axis ($\bar{1}100$), m-axis ($01\bar{1}0$), m-axis ($10\bar{1}0$), m-axis ($1\bar{1}00$), m-axis ($0\bar{1}10$), r-axis ($10\bar{1}1$), r-axis ($\bar{1}01\bar{1}$), r-axis ($0\bar{1}1\ 1$), r-axis ($0\bar{1}1\bar{1}$), r-axis ($1\ \bar{1}0\bar{1}$) and r-axis ($\bar{1}101$);

the sensing module further includes an insulating layer;

the first sensing layer has a first surface and a second surface, wherein the first surface directly contacts the sapphire substrate, and the insulating layer is formed on the second surface;

the first sensing layer includes an x-axis sensing circuit net and a y-axis sensing circuit net, wherein the x-axis sensing circuit net and the y-axis sensing circuit net interlaces with each other from a top view and are not electrically connected to each other;

the first sensing layer is an ITO transparent conductive film; and the sensing module is formed on the sapphire substrate by a photolithography process.

10. The touch panel structure of any one of Embodiments 6-9, wherein the touch panel structure further comprises a conducting wire circuit layer formed on the insulating layer, and electrically connected to the x-axis sensing circuit net and the y-axis sensing circuit net; and the sapphire substrate serves as a cover for the touch panel structure.

11. A touch panel structure, comprising:

a sapphire substrate having a single-crystal structure; and a sensing module including a first sensing layer directly disposed on the sapphire substrate.

12. The touch panel structure of Embodiment 11, wherein:

the sapphire substrate further has a crystal axis including one selected from a group consisting of c-axis (0001), a-axis ($1\bar{2}10$), a-axis ($1\ 1\bar{2}0$), a-axis ($2\bar{1}\bar{1}0$), a-axis ($\bar{1}\bar{1}20$), a-axis ($\bar{2}1\ 10$), a-axis ($\bar{1}2\bar{1}0$), m-axis ($\bar{1}010$), m-axis ($\bar{1}100$), m-axis ($01\bar{1}0$), m-axis ($10\bar{1}0$), m-axis ($1\bar{1}00$), m-axis ($0\bar{1}10$), r-axis ($10\bar{1}1$), r-axis ($\bar{1}01\bar{1}$), r-axis ($01\bar{1}\bar{1}$), r-axis ($0\bar{1}1\ 1$), r-axis ($1\ \bar{1}0\bar{1}$) and r-axis ($\bar{1}101$);

the sensing module further includes an insulating layer and a second sensing layer;

the first sensing layer has a first surface and a second surface, wherein the first surface directly contacts the sapphire substrate, and the insulating layer is formed on the second surface;

the second sensing layer is formed on the insulating layer;

the first sensing layer includes an x-axis sensing circuit net, and the second sensing layer includes a y-axis sensing circuit net, wherein the x-axis sensing circuit net and the y-axis sensing circuit net interlaces with each other from a top view and are not electrically connected to each other;

the first sensing layer and the second sensing layer are both indium tin oxide (ITO) transparent conductive films;

the sensing module is formed on the sapphire substrate by a photolithography process; and the sapphire substrate further has a transmittance being one of percentages larger than and equal to 80%.

13. The touch panel structure of any one of Embodiments 11-12, wherein the touch panel structure further comprises a conducting wire circuit layer formed on the second sensing layer, and electrically connected to the x-axis sensing circuit net and the y-axis sensing circuit net; and the sapphire substrate serves as a cover for the touch panel structure.

14. The touch panel structure of any one of Embodiments 11-13, wherein:

the sapphire substrate further has a crystal axis including one selected from a group consisting of c-axis (0001), a-axis (1$\bar{2}$10), a-axis (1 1$\bar{2}$0), a-axis (2$\bar{1}\bar{1}$0), a-axis ($\bar{1}\bar{1}$20), a-axis ($\bar{2}$1 10), a-axis ($\bar{1}$2$\bar{1}$0), m-axis ($\bar{1}$010), m-axis ($\bar{1}$100), m-axis (01$\bar{1}$0), m-axis (10$\bar{1}$0), m-axis (1$\bar{1}$00), m-axis (0$\bar{1}$1 0), r-axis (10$\bar{1}$1), r-axis ($\bar{1}$0 1$\bar{1}$), r-axis (0$\bar{1}$1 1), r-axis (0$\bar{1}$1 1), r-axis (1$\bar{1}$0$\bar{1}$) and r-axis ($\bar{1}$101);

the sensing module further includes an insulating layer;

the first sensing layer has a first surface and a second surface, wherein the first surface directly contacts the sapphire substrate, and the insulating layer is formed on the second surface;

the first sensing layer includes an x-axis sensing circuit net and a y-axis sensing circuit net, wherein the x-axis sensing circuit net and the y-axis sensing circuit net interlaces with each other from a top view and are not electrically connected to each other;

the first sensing layer is an ITO transparent conductive film;

the sensing module is formed on the sapphire substrate by a photolithography process; and the sapphire substrate further has a transmittance being one of percentages larger than and equal to 80%.

15. The touch panel structure of any one of Embodiments 11-14, wherein the touch panel structure further comprises a conducting wire circuit layer formed on the insulating layer, and electrically connected to the x-axis sensing circuit net and the y-axis sensing circuit net; and the sapphire substrate serves as a cover for the touch panel structure.

16. A touch panel structure, comprising:
a touch screen; and
a sensing module having a bottom layer directly disposed on the touch screen.

17. The touch panel structure of Embodiment 16, wherein:
the touch screen includes a sapphire substrate;
the sapphire substrate has a single-crystal structure;
the sapphire substrate further has a crystal axis including one selected from a group consisting of c-axis (0001), a-axis (1$\bar{2}$10), a-axis (1 1$\bar{2}$0), a-axis (2$\bar{1}\bar{1}$0), a-axis ($\bar{1}\bar{1}$20), a-axis ($\bar{2}$1 10), a-axis ($\bar{1}$2$\bar{1}$0), m-axis ($\bar{1}$010), m-axis ($\bar{1}$100), m-axis (01$\bar{1}$0), m-axis (10$\bar{1}$0), m-axis (1$\bar{1}$00), m-axis (0$\bar{1}$10), r-axis (10$\bar{1}$1), r-axis ($\bar{1}$01$\bar{1}$), r-axis (01$\bar{1}\bar{1}$), r-axis (0$\bar{1}$1 1), r-axis (1$\bar{1}$0$\bar{1}$) and r-axis ($\bar{1}$101);

the bottom layer includes a sensing layer and an insulating layer;

the sensing layer has a first surface and a second surface, wherein the first surface directly contacts the sapphire substrate, and the insulating layer is formed on the second surface;

the sensing layer includes an x-axis sensing circuit net and a y-axis sensing circuit net, wherein the x-axis sensing circuit net and the y-axis sensing circuit net interlaces with each other from a top view and are not electrically connected to each other;

the sensing layer is an ITO transparent conductive film;

the sensing module is formed on the sapphire substrate by a photolithography process; and the sapphire substrate further has a transmittance being one of percentages larger than and equal to 80%.

18. The touch panel structure of any one of Embodiments 16-17, wherein the touch panel structure further comprises a conducting wire circuit layer formed on the insulating layer, and electrically connected to the x-axis sensing circuit net and the y-axis sensing circuit net; and the sapphire substrate serves as a cover for the touch panel structure.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A touch panel structure, comprising:
a sapphire substrate having a crystal axis, a crystal structure and a transmittance, wherein the crystal axis comprises one selected from a group consisting of c-axis (0001), a-axis (1$\bar{2}$10), a-axis (11$\bar{2}$0), a-axis (2$\bar{1}\bar{1}$0), a-axis ($\bar{1}\bar{1}$20), a-axis ($\bar{2}$1 10), a-axis ($\bar{1}$2$\bar{1}$0), m-axis ($\bar{1}$010), m-axis ($\bar{1}$100), m-axis (0 1$\bar{1}$0), m-axis (10$\bar{1}$0), m-axis (1$\bar{1}$00), m-axis (0$\bar{1}$10), r-axis (10$\bar{1}$1), r-axis ($\bar{1}$01 $\bar{1}$), r-axis (01$\bar{1}\bar{1}$), r-axis (0$\bar{1}$1 1), r-axis (1$\bar{1}$0$\bar{1}$) and r-axis ($\bar{1}$101), wherein the crystal structure is a single-crystal structure, and the transmittance is one of percentages larger than and equal to 80%; and
a sensing module having a first sensing layer directly disposed on the sapphire substrate, wherein:
the sensing module further includes an insulating layer;
the first sensing layer has a first surface and a second surface, wherein the first surface directly contacts the sapphire substrate, and the insulating layer is formed on the second surface;
the first sensing layer includes an x-axis sensing circuit net and a y-axis sensing circuit net, wherein the x-axis sensing circuit net and the y-axis sensing circuit net interlace with each other from a top view and are not electrically connected to each other;
the first sensing layer is an ITO transparent conductive film; and
the sensing module is formed on the sapphire substrate by a photolithography process.

2. A touch panel structure as claimed in claim 1, wherein the touch panel structure further comprises a conducting wire circuit layer formed on the insulating layer, and electrically connected to the x-axis sensing circuit net and the y-axis sensing circuit net.

3. A touch panel structure, comprising:
a sapphire substrate having a crystal structure and a transmittance, wherein the crystal structure is a single-crystal structure, and the transmittance is one of percentages larger than and equal to 80%; and
a sensing module comprising a first sensing layer directly disposed on the sapphire substrate, wherein
the sapphire substrate further has a crystal axis including one selected from a group consisting of c-axis (0001), a-axis (1$\bar{2}$10), a-axis (1 1$\bar{2}$0), a-axis (2$\bar{1}\bar{1}$0), a-axis ($\bar{1}\bar{1}$20), a-axis ($\bar{2}$1 10), a-axis ($\bar{1}$2$\bar{1}$0), m-axis ($\bar{1}$010), m-axis ($\bar{1}$100), m-axis (01$\bar{1}$0), m-axis (10$\bar{1}$0), m-axis (1$\bar{1}$00), m-axis (0$\bar{1}$10), r-axis (1 0$\bar{1}$1), r-axis ($\bar{1}$01$\bar{1}$), r-axis (01$\bar{1}\bar{1}$), r-axis (0$\bar{1}\bar{1}$ 1), r-axis (1$\bar{1}$0$\bar{1}$) and r-axis ($\bar{1}$101);
the sensing module further includes an insulating layer;
the first sensing layer has a first surface and a second surface, wherein the first surface directly contacts the sapphire substrate, and the insulating layer is formed on the second surface;
the first sensing layer includes an x-axis sensing circuit net and a y-axis sensing circuit net, wherein the x-axis sensing circuit net and the y-axis sensing circuit net interlace with each other from a top view and are not electrically connected to each other;

the first sensing layer is an ITO transparent conductive film; and the sensing module is formed on the sapphire substrate by a photolithography process.

4. A touch panel structure as claimed in claim 3, wherein the touch panel structure further comprises a conducting wire circuit layer formed on the insulating layer, and electrically connected to the x-axis sensing circuit net and the y-axis sensing circuit net; and the sapphire substrate serves as a cover for the touch panel structure.

5. A touch panel structure, comprising:

a sapphire substrate having a single-crystal structure; and
  a sensing module including a first sensing layer directly disposed on the sapphire substrate, the sapphire substrate further has a crystal axis including one selected from a group consisting of c-axis (0001), a-axis ($1\bar{2}10$), a-axis ($1\ 1\bar{2}0$), a-axis ($2\bar{1}\bar{1}0$), a-axis ($\bar{1}\bar{1}20$), a-axis ($\bar{2}1\ 10$), a-axis ($\bar{1}2\bar{1}0$), m-axis ($\bar{1}010$), m-axis ($\bar{1}100$), m-axis ($0\ 1\bar{1}0$), m-axis ($10\bar{1}0$), m-axis ($1\bar{1}00$), m-axis ($0\bar{1}10$), r-axis ($1\ 0\bar{1}1$), r-axis ($\bar{1}01\bar{1}$), r-axis ($01\bar{1}\bar{1}$), r-axis ($0\bar{1}1\ 1$), r-axis ($1\bar{1}0\bar{1}$) and r-axis ($\bar{1}101$);

the sensing module further includes an insulating layer;

the first sensing layer has a first surface and a second surface, wherein the first surface directly contacts the sapphire substrate, and the insulating layer is formed on the second surface;

the first sensing layer includes an x-axis sensing circuit net and a y-axis sensing circuit net, wherein the x-axis sensing circuit net and the y-axis sensing circuit net interlace with each other from a top view and are not electrically connected to each other;

the first sensing layer is an ITO transparent conductive film;

the sensing module is formed on the sapphire substrate by a photolithography process; and the sapphire substrate further has a transmittance being one of percentages larger than and equal to 80%.

6. A touch panel structure as claimed in claim 5, wherein the touch panel structure further comprises a conducting wire circuit layer formed on the insulating layer, and electrically connected to the x-axis sensing circuit net and the y-axis sensing circuit net; and the sapphire substrate serves as a cover for the touch panel structure.

7. A touch panel structure, comprising:

a touch screen; and a sensing module having a bottom layer directly disposed on the touch screen, wherein the touch screen comprises a sapphire substrate, the sapphire substrate has a single-crystal structure;

the sapphire substrate further has a crystal axis including one selected from a group consisting of c-axis (0001), a-axis ($1\bar{2}10$), a-axis ($1\ 1\bar{2}0$), a-axis ($2\bar{1}\bar{1}0$), a-axis ($\bar{1}\bar{1}20$), a-axis ($\bar{2}1\ 10$), a-axis ($\bar{1}2\bar{1}0$), m-axis ($\bar{1}010$), m-axis ($\bar{1}100$), m-axis ($01\bar{1}0$), m-axis ($10\bar{1}0$), m-axis ($1\bar{1}00$), m-axis ($0\bar{1}10$), r-axis ($1\ 0\bar{1}1$), r-axis ($\bar{1}01\bar{1}$), r-axis ($01\bar{1}\bar{1}$), r-axis ($0\bar{1}1\ 1$), r-axis ($1\bar{1}0\bar{1}$) and r-axis ($\bar{1}101$);

the bottom layer includes a sensing layer and an insulating layer;

the sensing layer has a first surface and a second surface, wherein the first surface directly contacts the sapphire substrate, and the insulating layer is formed on the second surface;

the sensing layer includes an x-axis sensing circuit net and a y-axis sensing circuit net, wherein the x-axis sensing circuit net and the y-axis sensing circuit net interlace with each other from a top view and are not electrically connected to each other;

the sensing layer is an ITO transparent conductive film;

the sensing module is formed on the sapphire substrate by a photolithography process; and the sapphire substrate further has a transmittance being one of percentages larger than and equal to 80%.

8. A touch panel structure as claimed in claim 7, wherein the touch panel structure further comprises a conducting wire circuit layer formed on the insulating layer, and electrically connected to the x-axis sensing circuit net and the y-axis sensing circuit net.

* * * * *